(12) United States Patent
Sebald et al.

(10) Patent No.: US 10,859,636 B2
(45) Date of Patent: Dec. 8, 2020

(54) UNINTERRUPTIBLE POWER SUPPLY (UPS) MODULES FOR TESTING SYSTEMS

(71) Applicant: Eaton Intelligent Power Limited, Dublin (IE)

(72) Inventors: Robert Charles Sebald, Raleigh, NC (US); George Arthur Navarro, Raleigh, NC (US); Gavin Girish Saldanha, Durham, NC (US)

(73) Assignee: Eaton Intelligent Power Limited

( * ) Notice: Subject to any disclaimer, the term of this patent is extended or adjusted under 35 U.S.C. 154(b) by 0 days.

(21) Appl. No.: 16/721,257

(22) Filed: Dec. 19, 2019

(65) Prior Publication Data

US 2020/0124682 A1   Apr. 23, 2020

Related U.S. Application Data

(62) Division of application No. 14/974,904, filed on Dec. 18, 2015, now Pat. No. 10,551,444, which is a division of application No. 13/717,740, filed on Dec. 18, 2012, now Pat. No. 9,239,364.

(51) Int. Cl.
| | |
|---|---|
| *G01R 31/40* | (2020.01) |
| *G01R 31/42* | (2006.01) |
| *G06F 1/30* | (2006.01) |
| *H02J 9/04* | (2006.01) |
| *H02J 9/06* | (2006.01) |

(52) U.S. Cl.
CPC ............ *G01R 31/40* (2013.01); *G01R 31/42* (2013.01); *G06F 1/305* (2013.01); *H02J 9/04* (2013.01); *H02J 9/061* (2013.01)

(58) Field of Classification Search
None
See application file for complete search history.

(56) References Cited

U.S. PATENT DOCUMENTS

| | | |
|---|---|---|
| 5,019,717 A | 5/1991 | McCurry |
| 6,124,797 A | 9/2000 | Mercado .......... G01R 19/16542 340/636.15 |
| 6,236,226 B1 | 5/2001 | Hagiwara |
| 6,856,162 B1 | 2/2005 | Greatorex ............ G01R 15/125 320/132 |
| 6,862,199 B2 | 3/2005 | Escobar et al. |
| 7,265,458 B2 | 9/2007 | Edelen et al. |
| 7,403,364 B2 | 7/2008 | Anderson et al. |

(Continued)

OTHER PUBLICATIONS

Office Action; corresponding European Patent Application No. 13814796.2; dated Oct. 10, 2018; 5 pages.

(Continued)

*Primary Examiner* — Paresh Patel
(74) *Attorney, Agent, or Firm* — Stanek Lemon Crouse & Meeks, P.A.

(57) ABSTRACT

A method of operating an Uninterruptible Power Supply (UPS) system can be provided by activating an idle state for a UPS module included in the UPS system and providing a UPS module test input to the UPS module in the idle state. A UPS module test response can be provided from the UPS module in the idle state, to the UPS module test input. The UPS module test response can be compared to a predetermined UPS module test response and the UPS module can be identified as a potentially faulty UPS module responsive to determining that the UPS module test response varies from the predetermined UPS module test response by more than a threshold value.

20 Claims, 6 Drawing Sheets

(56) References Cited

U.S. PATENT DOCUMENTS

| | | | |
|---|---|---|---|
| 7,567,060 B1 | 7/2009 | Atcitty | G01R 31/40 307/64 |
| 7,583,109 B2 | 9/2009 | Oughton, Jr. et al. | |
| 7,948,778 B2 | 5/2011 | Pfitzer et al. | |
| 8,203,235 B2 | 6/2012 | Fox | |
| 8,410,739 B2 | 4/2013 | Hendrickson et al. | |
| 9,239,364 B2 | 1/2016 | Sebald | G01R 31/42 |
| 2007/0210652 A1 | 9/2007 | Tracy et al. | |
| 2009/0033154 A1 | 2/2009 | Linkhart | H02J 9/06 307/65 |
| 2009/0068517 A1 | 3/2009 | Andersen | H01M 8/04201 429/429 |
| 2010/0226051 A1 | 9/2010 | Nair | |
| 2013/0020872 A1 | 1/2013 | Kinnard | H02J 9/061 307/64 |
| 2014/0136130 A1 | 5/2014 | Nelson | G01R 31/40 702/58 |

OTHER PUBLICATIONS

International Search Report and the Written Opinion of the International Searching Authority corresponding to International Application No. PCT/US2013075297, dated Apr. 22, 2014; 9 pages.

International Preliminary Report on Patentability corresponding to International Application No. PCT/US2013/075297, dated Jul. 2, 2015; 7 pages.

UNINTERRUPTIBLE POWER SUPPLY (UPS) MODULES FOR TESTING SYSTEMS

RELATED APPLICATIONS

The present application is a divisional of U.S. patent application Ser. No. 14/974,904; filed Dec. 18, 2015, which is a divisional of U.S. patent application Ser. No. 13/717,740 filed Dec. 18, 2012 in the United States Patent Office, the disclosures of which are hereby incorporated by reference in their entireties.

BACKGROUND

The present invention relates to uninterruptible power supply systems (UPS), and more particularly, to testing UPS systems.

UPS systems are commonly used in installations such as data centers, medical centers and industrial facilities to provide backup power to maintain operation in event of failure of the primary utility supply. These UPS systems often have an "on-line" configuration including components, such as, a rectifier and inverter coupled by a DC link that is also coupled to an auxiliary power source, such as a battery, fuel cell or other energy storage device. UPS systems may include two or more UPS modules, each of which may include the components described above. The UPS modules commonly are designed to operate in parallel to provide scalable power capacity, e.g., the UPS modules may be coupled in common to an AC source, a DC source (e.g., a battery) and to a load.

UPS systems typically may be configured for testing when, for example, a diagnostic is run, which may result in the UPS systems being brought off-line. Various UPS arrangements are discussed further in, for example, U.S. Pat. No. 7,265,458 to Edelen et al., U.S. Pat. No. 7,403,364 to Anderson et al., U.S. Pat. No. 7,583,109 to Oughton Jr. et al., and U.S. Pat. No. 7,948,778 to Pfitzer et al., the disclosures of each of which are incorporated herein in their entireties.

SUMMARY

Embodiments according to the present invention can provide methods, systems, and modules for testing UPS systems with multiple UPS modules. Pursuant to these embodiments, a method of operating a UPS system can be provided by activating an idle state for a UPS module included in the UPS system and providing a UPS module test input to the UPS module in the idle state. A UPS module test response can be provided from the UPS module in the idle state, to the UPS module test input. The UPS module test response can be compared to a predetermined UPS module test response and the UPS module can be identified as a potentially faulty UPS module responsive to determining that the UPS module test response varies from the predetermined UPS module test response by more than a threshold value.

In some embodiments according to the invention, identifying the UPS module as a potentially faulty UPS module can be provided by comparing the UPS module test response to a predetermined UPS module test response and transmitting a service indicator that identifies the UPS module as potentially faulty. In some embodiments according to the invention, the UPS module test response varies from the predetermined UPS module test response by an amount associated with a faulty power supply in the UPS module, a faulty fan in the UPS module, a faulty power conversion circuit in the UPS, a faulty DC link capacitor, a faulty inverter circuit, a faulty rectifier circuit, a faulty DC-DC converter circuit, a faulty output filter circuit, or any combination thereof.

In some embodiments according to the invention, the UPS module test response varies from the predetermined UPS module test response by an amount associated with a faulty component included in the UPS module, the faulty component being configured to operate when the UPS module is in the idle state.

In some embodiments according to the invention, activating the idle state for the UPS module includes configuring the UPS module to provide no power to the load. In some embodiments according to the invention, configuring the UPS module to provide no power to the load can include opening a contactor located between the load and an inverter circuit included in the UPS module or electrically isolating an output of a rectifier circuit from the load.

In some embodiments according to the invention, the method can further include preventing the UPS module from providing power to the load responsive to identifying the UPS module as the potentially faulty UPS module. In some embodiments according to the invention, the method can further include identifying the UPS module as a functional UPS module responsive to determining that the UPS module test response varies from the predetermined UPS module test response by less than the threshold value and deactivating the idle state for the UPS module.

In some embodiments according to the invention, activating the idle state for the UPS module comprises activating the idle state for a first UPS module responsive to determining that a second UPS module included in the UPS system is configured to provide the power to the load, while the first UPS module is in the idle state.

In some embodiments according to the invention, a method of operating an Uninterruptible Power Supply (UPS) system, and be provided by activating an idle state for a UPS module included in the UPS system. A UPS module test power input is provided to the to the UPS module in the idle state and a UPS module test power response to the UPS module test power input is provided. The UPS module test power response can be compared to a predetermined UPS module test power response.

DETAILED DESCRIPTION OF EMBODIMENTS ACCORDING TO THE INVENTION

Figure 1:
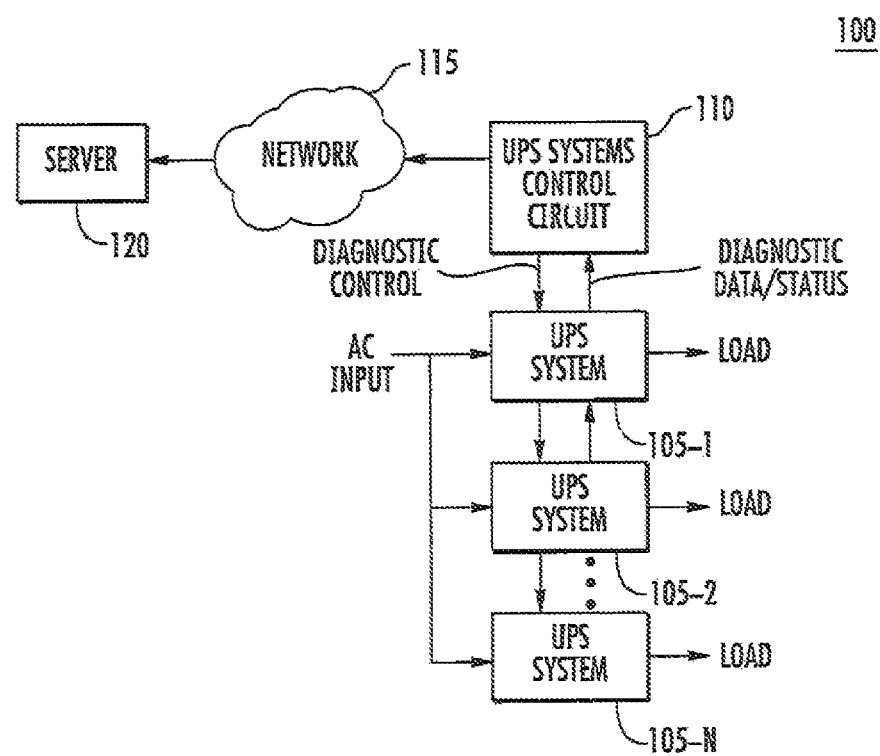
FIG. 1 is a block diagram illustrating a hierarchal arrangement of UPS systems in embodiments according to the invention.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

As will be appreciated by one skilled in the art, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor or control circuit of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

As described herein, in some embodiments according to the invention, a UPS module included in a UPS system can be placed in an idle state so that various tests can be carried out on the UPS module, while the UPS system continues to provide power to a load using other UPS modules. For example, in some embodiments according to the invention, a UPS system may include multiple UPS modules, each of which can be configured to provide power to a load when the respective module is operating in an active state. When, however, the UPS system determines that the load can be carried by less than all of the UPS modules, selected ones of the UPS modules can be placed in an idle state, whereupon diagnostic tests can be performed on the UPS module in the idle state. In the idle state, various diagnostic tests can be performed on the UPS module which may not otherwise be realizable when the UPS module provides power to the load. In other words, once the UPS module is placed in the idle state, the UPS module may be manipulated by the diagnostics in ways that would possibly interrupt provisioning of power of the load.

In some embodiments according to the invention, diagnostics can be carried out on the UPS module in the idle state focusing on power values of the UPS module and/or power values associated with individual systems or circuits within the UPS module in the idle state. For example, in some embodiments according to the invention, a total power test can be carried out on the UPS module when in the idle state, the value of which can be compared to a predetermined power value associated with a known, non-faulty, UPS module. Other diagnostic tests can be performed on the different subsystems and circuits within the UPS module, such as a rectifier circuit, an inverter circuit, a DC-DC converter circuit, an output filter circuit, and a DC link capacitor, etc. Similarly, those test results can be compared to predetermined values associated with the circuits or systems under test to determine if the circuits or systems are likely faulty.

FIG. 1 is a block diagram illustrating a hierarchal UPS system 100 in some embodiments according to the invention. According to FIG. 1, the UPS system 100 can include multiple UPS systems 105-1 to N. Each of the UPS systems 105-1 to N is coupled to an AC input bus which can provide each of the UPS systems 105-1 to N with AC power, both for conducting internal operations of the respective UPS system, as well as providing power to the load. It will be understood that various ones of the UPS systems may receive AC power via various distribution paths, such as switches, panels, etc.

As further shown in FIG. 1, the UPS system 100 includes a UPS systems control circuit 110 which is operatively coupled to each of the UPS systems 105-1 to N. The UPS systems control circuit 110 can transmit (among other things) diagnostic control data to each of the UPS systems 105-1 to N, and can receive corresponding diagnostic data/status from each of the systems. Accordingly, the UPS systems control circuit 110 can cause each of the UPS systems 105-1 to N to enter an idle state, whereupon diagnostic operations can be carried out within the respective UPS system 105-1 to N. In addition, each of the UPS systems 105-1 to N can provide diagnostic data/status to the UPS systems control circuit 110 indicating, for example, the results of the completed diagnostics. In some embodiments according to the invention, it will be understood that the UPS systems 105-1 to N can provide partial diagnostic data/status, as the diagnostics progress.

During provisioning of power to the load, the UPS systems control circuit 110 can, for example, instruct the UPS system 105-1 to enter an idle state while maintaining UPS systems 105-2 to N in the active state, so that the load coupled thereto is provided adequate power. It will be further understood that the UPS system 105-1 may provide no power to the load when in the idle state. The UPS systems control circuit 110 can further control the UPS system 105-1 to perform diagnostic operations while in the idle state and return diagnostic data/status. Upon completion, the UPS systems control circuit 110 may determine whether the UPS system 105-1 includes faulty components or subsystems, and to the extent that UPS system 105-1 should remain idle. Alternatively, the UPS systems control circuit 110 may determine, based on the diagnostic data/status, that the UPS system 105-1 is operational and may exit the idle state, to provide power to the load. It will be understood that each of other the systems 105-2 to N, can also be controlled as described above.

Still further, the UPS systems control circuit 110 can aggregate diagnostic data/status from the UPS systems 105-1 to N and forward such aggregated information to a server 120, which may operate at a higher level in the hierarchy in which the UPS system 100 is located. It will be understood that the aggregated diagnostic information can be provided to the server 120 via any available network 115, such as the Internet, an intranet, or other networks. Server 120 may, in turn, aggregate data from other UPS systems, which may be located at the same site or over a wider region.

Although the embodiments described with reference to FIG. 1 illustrate the initiation of the idle state and diagnostics via the control circuit 110 located within the system 100, it will be understood that higher level circuits may initiate the idle state for the UPS system shown, and receive the associated diagnostic data/status.

Figure 2:
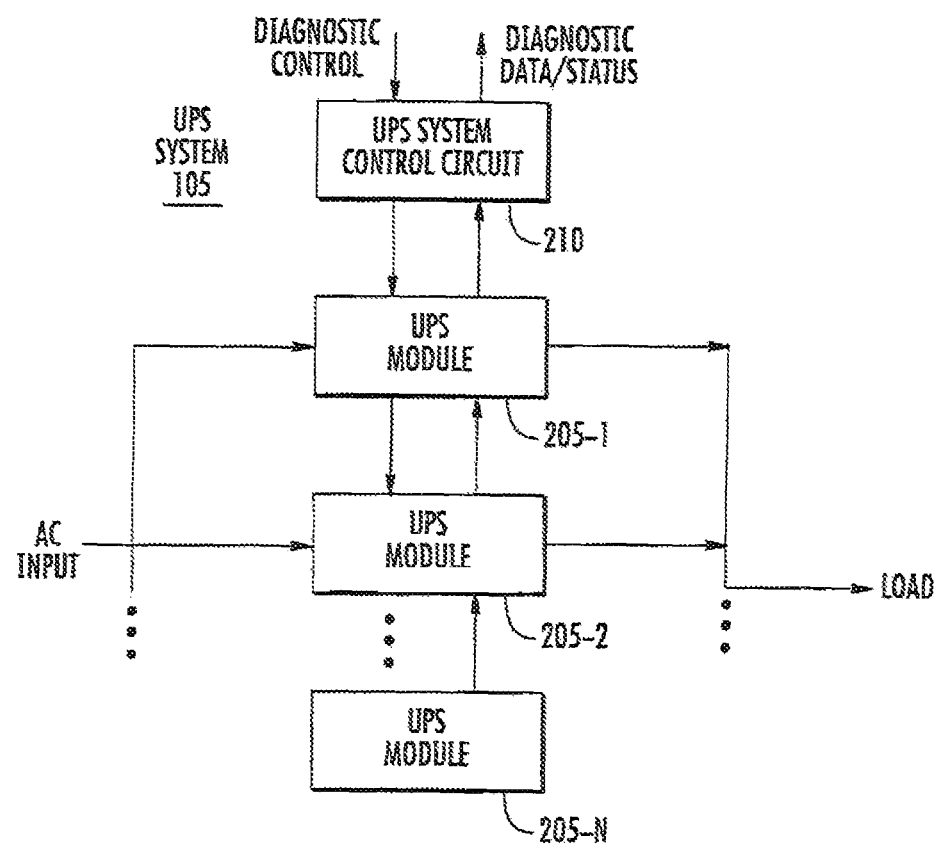
FIG. 2 is a block diagram illustrating a UPS system included in the hierarchy shown in FIG. 1 in some embodiments according to the invention.

FIG. 2 is a block diagram illustrating a representative UPS system 105 shown in FIG. 1 in some embodiments according to the invention. According to FIG. 2, the UPS system 105 includes multiple UPS modules 205-1 to N, each of which receives the AC input and is configured to provide power to the load under control of a UPS system control circuit 210. It will be understood that the UPS system control circuit 210 can be analogous to the UPS systems control circuit 110 shown in FIG. 1 operating at an upper level of the hierarchy. Still further, the UPS system control circuit 210 can transmit diagnostic control data to each of the UPS modules 205-1 to N and receive diagnostic data/status indicating the results of the diagnostics. It will also be understood that the diagnostic control provided by the UPS control circuit 210 can be initiated by the UPS systems control circuit 110 shown in FIG. 1 and, in turn, the diagnostic data/status returned from the UPS modules 205-1 to N can be forwarded to the UPS systems control circuit 110. In still other embodiments according to the invention, the diagnostic control and diagnostic data/status can be maintained at the level of the UPS system 105. In other words, the diagnostics may operate under the control of any level of the hierarchy in the system 100, and, specifically, may originate and be maintained in each of the UPS systems 105.

Figure 3:
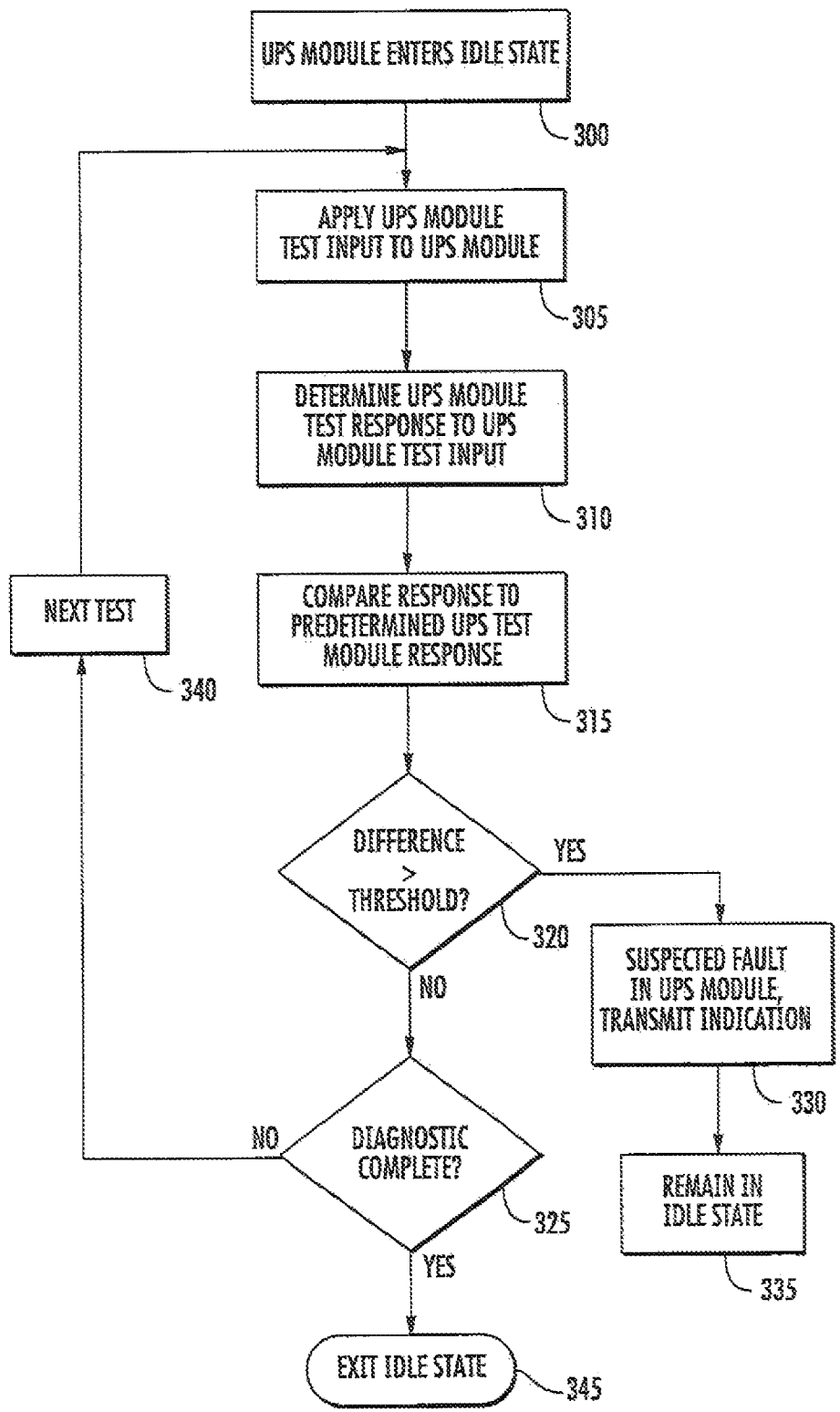
FIG. 3 is a flow chart that illustrates operations of UPS modules and systems in some embodiments according to the invention.

FIG. 3 is a flow chart that illustrates operations of a UPS module 205 operating in the UPS system 105 in some embodiments according to the invention. According to FIG. 3, the UPS module 205 enters the idle state (block 300), under control of either the UPS control circuit 210 or another UPS control circuit within the hierarchy. A UPS module test input is applied to the UPS module operating in the idle state (block 305).

The UPS module 205 in the idle state provides a response to the UPS module test input (block 310), which is compared to a predetermined UPS test module response (block 315). In some embodiments according to the invention, the predetermined UPS test module response can be based upon measurements or calculations that are associated within known good UPS modules or components thereof. For example, in some embodiments according to the invention, the UPS module test input may to be provide AC power at an input to the rectifier circuit, whereas the UPS module test response can be the measured power drawn at the input. Still further, the predetermined UPS test module response can be a nominal power drawn at the AC input by a UPS module, known not to be faulty.

Still referring to FIG. 3, the difference between the predetermined UPS test module response and the measured test response can be determined and compared to a threshold value, beyond which it may be considered that the UPS module (or circuit) may be faulty (block 320). If the difference between predetermined test module response and the measured test response does exceed the threshold, the UPS module is indicated as potentially faulty and the UPS module transmits an indication of the same (block 330). Upon receipt of the diagnostic data/status identifying the circuit or UPS module, as potentially faulty, the UPS system control circuit 210 may maintain the respective UPS module in the idle state (block 335). Still further, the UPS system control circuit 210 may retransmit the diagnostic data/status to upper levels of the hierarchy.

If, however, the difference between the predetermined UPS test module response and the measured test response is less than the threshold value (block 320), a determination is made as to whether the diagnostic test is complete (block 325). If the diagnostic is determined to be complete, the UPS module 205 may exit the idle state under control of the control circuit (block 345). It however, the diagnostic is determined not to be complete, the next diagnostic test in the suite may be selected (block 340), and operations continue at block 305.

Figure 4:
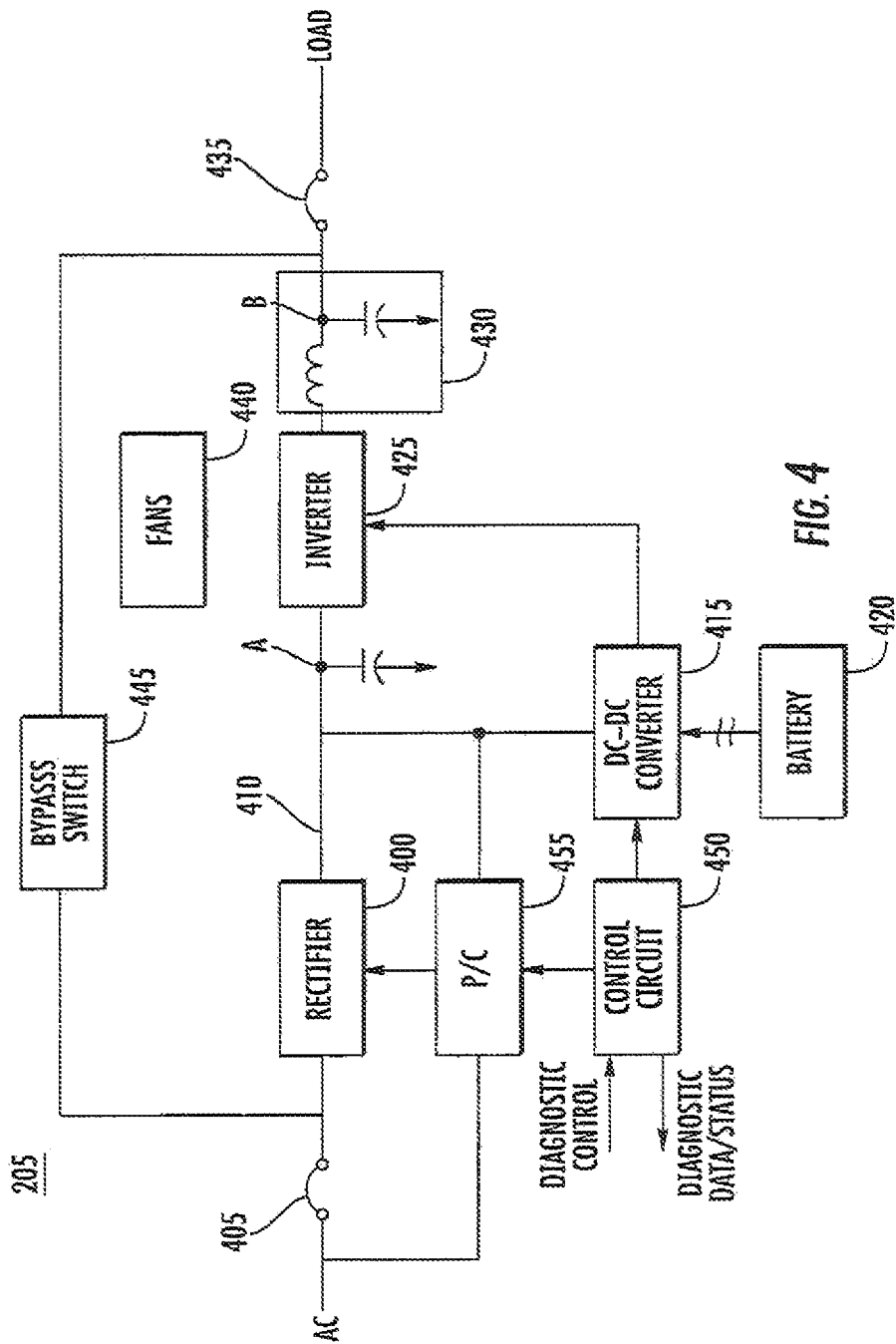
FIG. 4 is a block diagram illustrating a UPS module included in a system shown in FIG. 2 some in embodiments according to the invention.

FIG. 4 is a block diagram illustrating circuits included within the UPS module 205 shown in FIG. 2 in some embodiments according to the invention. According to FIG. 4, the UPS module 205 can provide power to the load based on the AC input. The power to the load can be provided through various mechanisms provided by the UPS module 205. For example, power can be provided to the load via a bypass switch 445, which may be operative under normal operating conditions when AC power provided, for example, by a utility can be passed through to the load. Further, power can be provided to the load through a rectifier circuit 400 which drives a DC link 410 that is coupled to the input of an inverter circuit 425. The DC link 410 is also coupled to a DC link capacitor, which maintains the node A at a DC link voltage at the input of the inverter circuit 425.

The inverter circuit 425 drives an output filter 430 which, in turn, can be switchably coupled to the load via a contactor 435. In particular, the contactor 435 may be open to electrically decouple the load from the UPS module 205. Accordingly, when the contactor 435 is open, the UPS module 205 can be in the idle state so that no power is provided to the load by the UPS module 205.

Power can also be provided to the load by a DC-DC converter circuit 415, which receives DC power from a battery 420, which can be associated with the UPS module 205. It will be understood that the battery 420 can be dedicated for use by the UPS module 205 and specifically for use by the DC-DC converter circuit 415. The DC-DC converter circuit 415 can maintain the DC link 410 at the DC link voltage, so that the rectifier circuit 425 can provide power to the load via the output filter 430 when the AC input is unavailable.

It will be understood that each of the circuits in the UPS module 205 can be operatively coupled to a control circuit 450. In operation, the control circuit 450 can monitor operations of the circuits included in the UPS module 205 and, moreover, can coordinate operation of the diagnostics and status information generated therefrom. For example, in some embodiments according to the invention, the control circuit 450 can control each of the circuits described herein to operate in support of the idle state. For example, when the control circuit 450 receives diagnostic control information from a higher order control circuit, the control circuit 450 may initiate the idle state for the UPS module 205, so that diagnostics may be carried out. In particular, the control circuit 450 can initiate the idle state for the UPS module 205 such that some of the circuits included in the module 205 enter a standby mode which may enable reduced power demand from the respective circuit placed in the standby mode. When the UPS module 205 is placed in the idle state, the control circuit 450, for example, can initiate testing of the UPS module 205. It will be understood that the tests can vary in scope from an overall UPS module test to tests that focus on individual components or subsystems. Further, the tests can vary in what parameters are tested, such as power, voltage, current, etc.

In some embodiments according to the invention, once the idle state is initiated, a total power drawn by the UPS module 205 may be measured by the control circuit 450. For example, the control circuit 450 may provide AC power at the rectifier circuit 400 as the UPS module test input and may measure the current and voltage drawn at the AC input to determine the power used by the UPS module 205 in the idle state (i.e., the UPS module test response). The control circuit 450 may then compare the measured power to a predetermined power value that is nominally associated with a UPS module known not to be faulty. If the measured power in idle state is about equal to the predetermined power used in the idle state, the control circuit 450 may indicate that the diagnostic test shows that the UPS module 250 is not faulty. It will be understood, however, that the test described above may be only one of a suite of diagnostic tests that can be performed on the UPS module 205 to diagnose whether the UPS module is faulty or not.

It will be understood that each of the components shown in FIG. 4 can include transducer circuits and/or sensor circuits that are accessible to the control circuit 450, to facilitate the measurement of currents, voltages, and other parameters associated with those circuits. These transducers and sensor circuits can therefore provide "metering" for the control circuit 450 so that the circuits and systems in the UPS module 205 can be tested by the control circuit 450.

In some embodiments according to the invention, the control circuit 450 can test the UPS module by closing the contactor 405. Once the contactor 405 is closed, the availability of the AC input will allow the components on the UPS module 205 to draw power from the AC input. The control circuit 450 can then measure the actual power drawn by all of the components on the UPS module 205 in the idle state as the response to the UPS module test input. It will be understood that even though the UPS module 205 operates in the idle state, many of the components included in the UPS module 205 will draw current either under control of the control circuit 450 or by operating in a standby power mode. In any event, each of the components that draws power from the AC input may contribute to the measured power drawn by the UPS module 205 in the idle state.

The predetermined power value may be provided by either calculations or data collected for actual UPS modules of the same type. If the measured power drawn at the AC input either exceeds or is less than the predetermined value, the UPS module may be determined to be faulty. In some embodiments according to the invention, a threshold value may be established to distinguish between allowable variations from the predetermined value. In other words, the measured power drawn at the AC input may fall within an acceptable range of the predetermined power value. In such cases, the UPS module 205 may still be identified as non-faulty if the measured power varies from the predetermined value by less than the threshold value. In some embodiments according to the invention, the threshold can be about +/−10% of the predetermined value. In some embodiments according to the invention, the threshold can be determined by statistical data gathered on operating UPS modules or on historical data associated with the particular UPS module under test including data gathered during manufacturing.

In some embodiments according to the invention, the amount of variation from the predetermined power value may indicate which circuit or system on the UPS module 205 is faulty. Data may be provided that identifies the amount of variation from the predetermined power value that may be observed if particular circuits or systems are faulty. For example, if the UPS module 205 includes a faulty fan 440, then the measured power may vary from the predetermined power value by a known amount. Analogous values may be established for other components, such as a faulty power conversion circuit (e.g., a half bridge IGBT circuit, a power MOSFET circuit, etc.), a faulty DC link capacitor, a faulty inverter circuit, a faulty rectifier circuit, a faulty DC-DC converter circuit and/or a faulty output filter circuit.

The control circuit 450 may also provide testing of the UPS module 205 at a lower level than the UPS module tests described above. For example, in some embodiments according to the invention, the control circuit 450 can control the rectifier circuit 400 to charge the DC link 410, and then measure the voltage of the DC link 410. If the voltage provided on the DC link 410 varies from a predetermined value for the DC link voltage, the rectifier circuit 400 (or the DC link 410) may be faulty.

In some embodiments according to the invention, the control circuit 450 can control a precharge circuit 455 to charge and discharge a DC link capacitor (including the DC link 410) which is responsible for maintaining the voltage at node A at the input of an inverter circuit 425. The control circuit 450 may measure the charge and discharge characteristics of the DC link capacitor, which can then be compared to predetermined values for the charging and discharging of the DC link capacitor. If the measured parameters vary from the predetermined values, the DC link capacitor or the rectifier circuit 400 may be faulty.

Figure 5A:
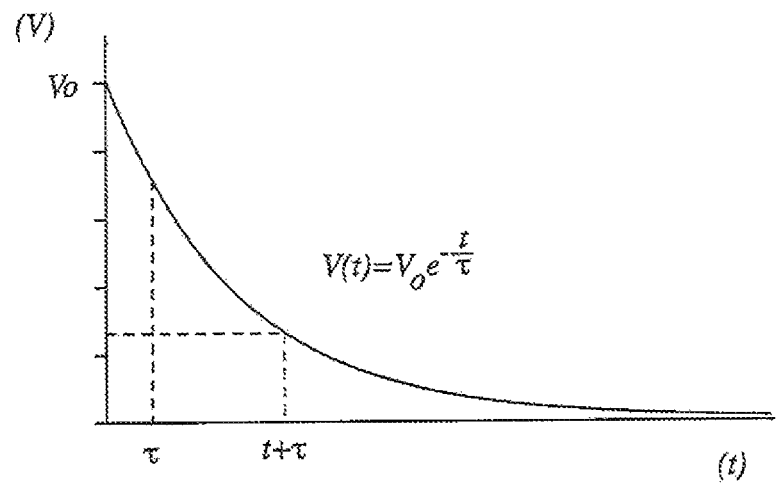
FIGS. 5A and 5B are graphs indicating discharging and charging characteristics, respectively, of a capacitor in some embodiments according to the invention.
Figure 5B:
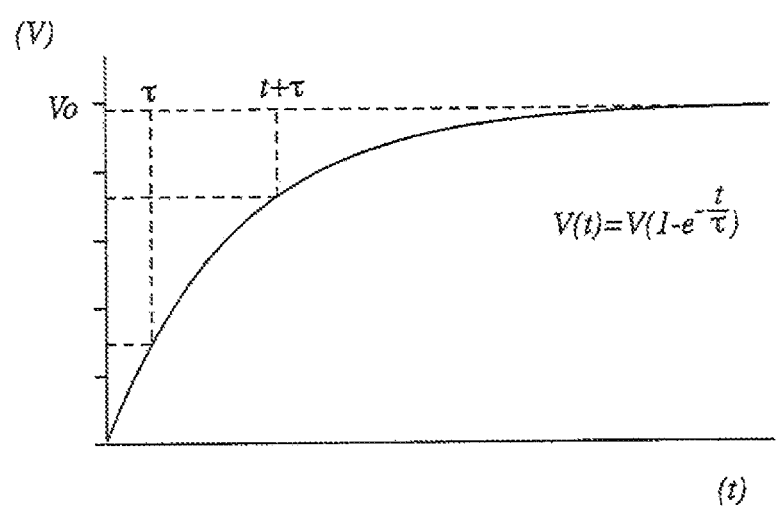

FIGS. 5A and 5B are graphs illustrating charging and discharging characteristics of a capacitor, such as the DC link capacitor, in some embodiments according to the invention. In particular, the parameters shown in FIGS. 5A and 5B can be determined when the control circuit 450 activates, for example, the rectifier circuit 400 to charge the DC link capacitor and to measure the voltages and times shown in FIGS. 5A and 5B using the associated expressions therein to determine whether the DC link capacitor is likely faulty using, for example, a calculated capacitance for the DC link capacitor based on the measured parameters.

In some embodiments according to the invention, the control circuit 450 may activate the DC-DC converter circuit 415 to charge the DC link capacitor and the DC link 410. In some embodiments according to the invention, the control circuit 450 can activate the DC-DC circuit 415 and measure the voltage and current provided to the DC link 410 by the DC-DC converter 415 to determine whether the DC-DC converter circuit 415 or DC link capacitor 425 is likely faulty.

In some embodiments according to the invention, the control circuit 450 can operate the rectifier circuit 400 to charge the DC link capacitor to a specified voltage and measure the power provided to the gate of a half bridge circuit included in the inverter circuit 425. In particular, insulated-gate bipolar transistors (IGBT) located within the half bridge circuit in the inverter circuit 425 can be tested by the control circuit 450 by providing a power gate signal to the IGBT devices while the UPS module is in the idle state. Application of the power gate signal to IGBT devices can be done as described in U.S. Pat. No. 7,583,109 to Oughton Jr. et al., the disclosure of which is incorporated herein by reference. Other approaches can also be used. It will be understood, however, that other types of power conversions circuits, such as power MOSFET circuits may be used in place of the a half bridge circuit including the insulated-gate bipolar transistors.

In still further embodiments according to the invention, the control circuit 450 can operate the inverter circuit 425 to drive an output filter circuit 430 with a predetermined waveform and may measure the voltage at node B, which can be compared to predetermined parameters for node B associated with a non-faulty rectified circuit 400, inverter circuit 425 and output filter circuit 430. For example, the inverter circuit 425 or rectifier circuit 400 can be controlled to provide a sine wave voltage to the output filter circuit 430, whereupon the waveform at node B can be sampled by the control circuit 450, which is sometimes referred to as a "capacitor bleed-down test."

Figure 6:
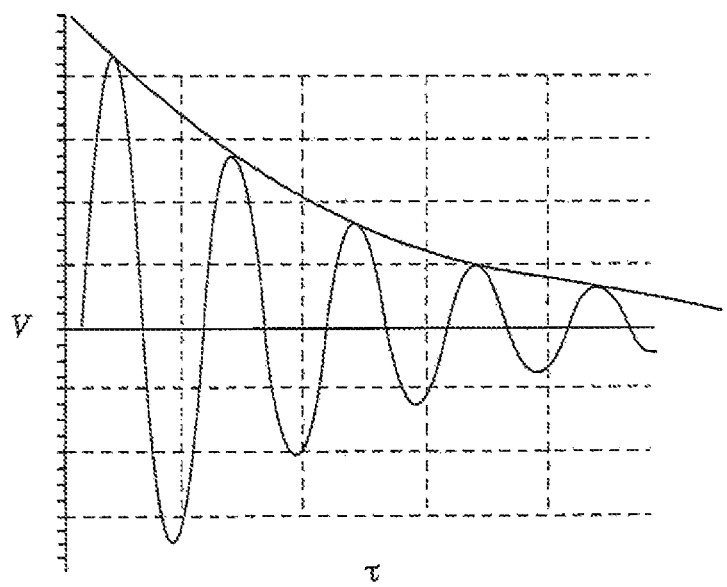
FIG. 6 is a graph illustrating bleed-down characteristics of an output filter circuit in some embodiments according to the invention.

FIG. 6 is a graph illustrating bleed-down characteristics of an output filter circuit in some embodiments according to the invention. According to FIG. 6, and as described above, a sine wave excitation can be provided to the inverter circuit 425 by the rectifier circuit 410 or DC-DC converter circuit 415 or the precharge circuit 455. In turn, the inverter circuit 425 can produce the sine wave response shown in FIG. 6 via the output filter circuit 430. In particular, the rate of discharge observed can provide an indication of the functionality of the inverter circuit 425 or the rectifier circuit 400 and other circuits.

It will be further understood that the capacitor bleed-down described herein can also be utilized to determine the functionality of the DC link capacitor as well as the rectifier circuit 400. In particular, the control circuit 450 can cause the rectifier circuit 400 to produce the decaying sine wave output shown in FIG. 6 at the input of the rectifier circuit 400 as described above in reference to the inverter circuit 425. Accordingly, it will be understood that the DC link capacitor shown in FIG. 4 can be tested by the control circuit 450 using the capacitor bleed-down approach shown in FIG. 6.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

What is claimed:

1. An Uninterruptible Power Supply (UPS) module configured for inclusion in a UPS system, the UPS module comprising:
   a rectifier circuit, switchahly coupled to an AC input to the UPS module, configured to provide a rectified output voltage to a DC link node;
   a DC-DC converter circuit, switchably coupled to a back-up power input to the UPS module, configured to provide DC voltage to the DC link node, based on the back-up power input;
   an inverter circuit, coupled to the DC link node, configured to provide an AC output for the UPS module based on the rectified output voltage or the DC voltage; and
   a control circuit configured to activate an idle state for the UPS module, and to provide a UPS module test power input to the rectifier circuit, the DC-DC converter circuit, and/or the inverter circuit, and configured to determine a UPS module test power response to the UPS module test power input, and to compare the UPS module test power response to a predetermined UPS module test power response.

2. The UPS module of claim 1 wherein the control circuit is further configured to identify the UPS module as a potentially faulty UPS module responsive to determining that the UPS module test power response varies from the predetermined UPS module test power response by more than a threshold value.

3. The UPS module of claim 1 wherein the UPS module test power response varies from the predetermined UPS module test power response by an amount of power associated with a faulty power supply, a faulty fan, a faulty half-bridge IGBT circuit in the UPS, a faulty DC link capacitor, a faulty inverter circuit, a faulty rectifier circuit, a faulty DC-DC converter circuit, a faulty output filter circuit, or any combination thereof.

4. The UPS module of claim 1 wherein the UPS module test control response varies from the predetermined UPS module test control response by a pre-determined test response or state change associated with a control board, control circuit, embedded firmware and/or non-volatile memory stored parameters, communication circuit or link, fault sensing or telemetry circuit, or any combination thereof.

5. The UPS module of claim 1 wherein the control circuit is configured to activate an idle state for the UPS module, provide the UPS module test power input to the UPS module in the idle state, provide power to a load by another UPS module in the UPS system.

6. The UPS module of claim 5 wherein the control circuit is configured to provide, from the UPS module in the idle state, a UPS module test response to the UPS module test power input and to identify the UPS module as a potentially faulty UPS module responsive to determining that the UPS module test response varies from the predetermined UPS module test response by more than a threshold value.

7. The UPS module of claim 1 wherein the control circuit is configured to identify the UPS module as a potentially faulty UPS module by comparing the UPS module test response to a predetermined UPS module test response and to transmit a service indicator that identifies the UPS module as potentially faulty.

8. The UPS module of claim 1 wherein the UPS module test response varies from the predetermined UPS module test response by an amount associated with a faulty component included in the UPS module, the faulty component being configured to operate when the UPS module is in the idle state.

9. The UPS module of claim 1 wherein the control circuit is configured to activate the idle state for the UPS module by configuring the UPS module to provide no power to the load.

10. The UPS module of claim 9 wherein control circuit is configured to provide no power to the load by opening a contactor located between the load and the inverter circuit or by electrically isolating an output of the rectifier circuit from the load.

11. The UPS module of claim 9 wherein control circuit is configured to prevent the UPS module from providing power to the load responsive to identifying the UPS module as the potentially faulty UPS module.

12. The UPS module of claim 1 wherein control circuit is configured to identify the UPS module as a functional UPS module responsive to determining that the UPS module test response varies from the predetermined UPS module test response by less than the threshold value and configured to deactivate the idle state for the UPS module.

13. The UPS module of claim 1 wherein the control circuit is configured to activate the idle state for the UPS module by activating the idle state for a first UPS module responsive to determining that a second UPS module included in the UPS system is configured to provide the power to the load, while the first UPS module is in the idle state.

14. The UPS module of claim 1 wherein the control circuit is configured to provide the UPS module test input to the UPS module in the idle state by applying an ac input to a rectifier circuit included in the UPS module; and
   wherein the control circuit is configured to provide, from the UPS module in the idle state, the UPS module test response by determining power provided to the rectifier circuit by the ac input in response to applying the ac input.

15. The UPS module of claim 1 wherein the control circuit is configured to provide the UPS module test input to the UPS module in the idle state by applying a test gate signal to a gate terminal of an IGBT device included in a half-bridge circuit in the inverter circuit when the UPS module is in the idle state; and
   wherein the control circuit is configured to provide, from the UPS module in the idle state, the UPS module test response by determining a power at the gate terminal in response to applying the test gate signal.

16. The UPS module of claim 1 wherein the control circuit is configured to provide the UPS module test input to the UPS module in the idle state by charging/discharging the DC link node of a capacitor at an input of the inverter circuit when the UPS module is in the idle state; and
   wherein the control circuit is configured to provide, from the UPS module in the idle state, UPS module test response by determining a capacitance of the capacitor based on the charging/discharging the DC link node.

17. The UPS module of claim 16 wherein the control circuit is configured to charge/discharge the DC link node by charging/discharging the DC link node using a precharge circuit coupled to the AC input.

18. The UPS module of claim 16 wherein the control circuit is configured to charge/discharge the DC link node by charging/discharging the DC link node using the DC-DC converter circuit coupled to a battery associated with the UPS module.

19. The UPS module of claim 16 wherein the control circuit is configured to charge/discharge the DC link node by charging/discharging the DC link node using the rectifier circuit coupled to the AC input.

20. The UPS module of claim 1 wherein the control circuit is configured to provide the UPS module test input to the UPS module in the idle state by providing an input signal to a filter circuit coupled to an output of the inverter circuit, when the UPS module is in the idle state; and wherein the control circuit is configured to provide, from the UPS module in the idle state, the UPS module test response by determining a response from the filter circuit generated by the input signal.

* * * * *

UNITED STATES PATENT AND TRADEMARK OFFICE
CERTIFICATE OF CORRECTION

PATENT NO. : 10,859,636 B2
APPLICATION NO. : 16/721257
DATED : December 8, 2020
INVENTOR(S) : Sebald et al.

Page 1 of 1

It is certified that error appears in the above-identified patent and that said Letters Patent is hereby corrected as shown below:

On the Title Page

Item [73] delete "Eaton Intelligent Power Limited"
And insert -- Eaton Intelligent Power Limited (IE) --

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*